(12) United States Patent
Hill et al.

(10) Patent No.: US 7,144,830 B2
(45) Date of Patent: Dec. 5, 2006

(54) PLURAL LAYER WOVEN ELECTRONIC TEXTILE, ARTICLE AND METHOD

(75) Inventors: Ian Gregory Hill, Mercer, NJ (US); Seth Trotz, Littleton, MA (US); George Herbert Needham Riddle, Princton, NJ (US); David Stuart Brookstein, Fort Washington, PA (US); Muthu Govindaraj, Harleysville, PA (US)

(73) Assignee: Sarnoff Corporation, Princeton, NJ (US)

( * ) Notice: Subject to any disclaimer, the term of this patent is extended or adjusted under 35 U.S.C. 154(b) by 354 days.

(21) Appl. No.: 10/431,763

(22) Filed: May 8, 2003

(65) Prior Publication Data

US 2003/0211797 A1    Nov. 13, 2003

Related U.S. Application Data

(60) Provisional application No. 60/419,159, filed on Oct. 17, 2002, provisional application No. 60/379,723, filed on May 10, 2002.

(51) Int. Cl.
*D03D 11/00* (2006.01)

(52) U.S. Cl. ............. 442/205; 442/301; 442/206; 442/207

(58) Field of Classification Search .......... 442/181, 442/185, 186, 205–207
See application file for complete search history.

(56) References Cited

U.S. PATENT DOCUMENTS

| | | | |
|---|---|---|---|
| 3,631,298 A | 12/1971 | Davis | |
| 4,158,103 A | 6/1979 | Danilin et al. | |
| 4,312,913 A * | 1/1982 | Rheaume | 442/187 |
| 4,460,803 A * | 7/1984 | Piper | 174/36 |
| 4,559,411 A * | 12/1985 | Piper | 174/117 M |
| 4,639,545 A * | 1/1987 | Pithouse et al. | 174/36 |
| 4,654,748 A | 3/1987 | Rees | |
| 4,668,545 A | 5/1987 | Lowe | |
| 4,700,054 A | 10/1987 | Triplett et al. | |
| 4,746,769 A * | 5/1988 | Piper | 174/117 M |
| 5,045,706 A | 9/1991 | Tanaka et al. | |
| 5,102,727 A | 4/1992 | Pittman et al. | |
| 5,358,758 A | 10/1994 | Skelton et al. | |
| 5,422,462 A | 6/1995 | Kishimoto | |
| 5,501,133 A | 3/1996 | Brookstein et al. | |
| 5,697,969 A | 12/1997 | Schmitt et al. | |
| 5,767,824 A | 6/1998 | Jacobsen | |
| 5,802,607 A | 9/1998 | Triplette | |

(Continued)

FOREIGN PATENT DOCUMENTS

WO    WO 99/19858    4/1999

(Continued)

OTHER PUBLICATIONS

Darpa, BAA01-41, "Electronic Textiles," (2 Pages), plus Section I (11 Pages) and Section II (4 Pages), 2001.

(Continued)

*Primary Examiner*—Cheryl A. Juska
*Assistant Examiner*—Arden B. Sperty
(74) *Attorney, Agent, or Firm*—Lowenstein Sandler PC

(57) ABSTRACT

A woven article having plural weave layers comprises a plurality of electrically insulating and/or electrically conductive yarn in the warp and a plurality of electrically insulating and/or electrically conductive yarn in the weft interwoven with the yarn in the warp. An electrical function is provided by one or more circuit carriers disposed in cavities in the plural layer woven article and/or one or more functional yarn in the warp and/or the weft, wherein the circuit carrier and/or functional yarn include an electrical contact for connecting to the electrically conductive yarn in the warp and/or weft.

10 Claims, 7 Drawing Sheets

U.S. PATENT DOCUMENTS

| | | | |
|---|---|---|---|
| 5,927,060 | A | 7/1999 | Watson |
| 5,962,967 | A | 10/1999 | Kiryuschev et al. |
| 6,032,450 | A | 3/2000 | Blum |
| 6,045,575 | A | 4/2000 | Rosen et al. |
| 6,072,619 | A | 6/2000 | Kiryuschev et al. |
| 6,145,551 | A | 11/2000 | Jayaraman et al. |
| 6,153,124 | A | 11/2000 | Hung |
| 6,210,771 | B1 | 4/2001 | Post et al. |
| 6,315,009 | B1 | 11/2001 | Jayaraman et al. |
| 6,326,947 | B1 | 12/2001 | Capps |
| 6,370,019 | B1 | 4/2002 | Matthies et al. |
| 6,381,482 | B1 | 4/2002 | Jayaraman et al. |
| 6,432,850 | B1 | 8/2002 | Takagi et al. |
| 6,608,438 | B1 * | 8/2003 | Topelberg et al. .......... 313/511 |
| 2001/0036785 | A1 | 11/2001 | Takagi et al. |
| 2002/0074937 | A1 | 6/2002 | Guberman et al. |
| 2002/0076948 | A1 | 6/2002 | Farrell et al. |
| 2002/0167483 | A1 | 11/2002 | Metcalf |

FOREIGN PATENT DOCUMENTS

| | | |
|---|---|---|
| WO | WO 99/41732 | 8/1999 |
| WO | WO 02/40091 | 5/2002 |

OTHER PUBLICATIONS

Thad Starner, "The Challenges Of Wearable Computing: Part 1," IEEE Micro, Georgia Institute Of Technology, pp. 44-52, Jul.-Aug. 2001.

Thad Starner, "The Challenges Of Wearable Computing: Part 2," IEEE Micro, Georgia Institute Of Technology, pp. 54-67, Jul.-Aug. 2001.

Engineering Researchers are Designing the Ultimate Fabrics, Virginia Tech, (Virginia Polytechnic and State University), http://newswise.com/p/articles/view/32667/, Printed Jun. 22, 2004, 2 Pages.

http://ww.research vt.edu/resmag/photo/STRETCH/jpg, Printed Jun. 22, 2004, 1 Page.

Maxim Integrated Products, "DS18B20X Flipchip 1-Wire Digital Thermometer," http://www.maxim-ic.com/quick_view2.cfm?qv_pk=2814, Printed Sep. 9, 2002, 2 Pages.

Sarnoff Corporation, "Large-Area Ultra-Flexible e-Textile Array Circuits Demonstrated with Color and IR Yarns." Proposal Abstract. Princeton, NJ, Sep. 27, 2001, 10 Pages.

Sarnoff Corporation, "e-Textile Interconnect and Component Attach Technology," vol. 1, Technical/Management Proposal, #2002314, Princeton, NJ, Dec. 4, 2001, 36 Pages.

Sarnoff Corporation, "Textile-based IR and Visible Active Camouflage," Concept Paper, Princeton, NJ, Feb. 7, 2002, 6 Pages.

Air Force Research Laboratory, "Programmable Infrared Marker," Fact Sheet, Kirkland AFB NM, http://de.afri.af.mil/Factsheets/pirm1.html, Printed May 28, 2002, 1 Page.

Post et al, "E-broidery: Design and fabrication of textile-based computing," IBM Systems Journal, vol. 39, No. 3 & 4, 2000, pp. 840-860.

Maxim Integrated Products, "World's First 4-Digit 5x7 Led Driver In A Single Chip!," Sunnyvale, CA, 2002, 1 Page.

Linx Technologies, "LC Series Transmitter Module Data Guide," Revised Dec. 21, 2001, 3 Pages.

Circuit Cellar, http://www.circuitcellar.com/pastissues/articles/jeff-105/text.html, Printed Jul. 16, 2002, 4 Pages.

Dallas Semiconductor Maxim, "1-Wire Products, Mixed-Signal Design Guide." 2001, 7 Pages.

Dallas Semiconductor, "DS2406 Dual addressable Switch Plus 1kbit Memory," www.maxim-ic.com, No date listed, 31 Pages.

Glenn Zorpette, "Let There Be Light," IEEE Spectrum, Sep. 2002, pp. 70-74.

Infineon Technologies AG, "News—Infineon presents concept for "smart" industrial textiles—far reaching fields of application for electronic integrated into textiles," http://www.infineon.com/cgi/ecrm.dll/jsp/showfrontend.do?lang-EN&news_nav_oid=997 . . . , May 5, 2003, 7 Pages.

Infineon Technologies AG, "News—Infineon develops chip network for textiles—Intelligence by the meter," May 5, 2003, 11 Pages.

International Search Report, May 19, 2005, 2 Pages.

Written Opinion of the International Searching Authority, May 19, 2005, 3 Pages.

International Search Report, Aug. 4, 2003, 4 Pages.

Science, "Electronic Textiles Charged Ahead," vol. 301, Aug. 15, 2003, pp. 909-911.

Listening Large: E-Textiles for Battlefield Sound Detection Begin Field Tests This Year, Information Sciences Institute, www.usc.edu/isinews/print/p57.html, Dated Oct. 11, 2002, Printed Jun. 22, 2004, 3 Pages.

Light-Science.com, Engineering researchers are designing the ultimate fabrics, for casual or military wear, www.light-science.com/vtfashion.html, Dated Nov. 7, 2002, 3 Pages.

Engineering Researchers are Designing the Ultimate Fabrics, for Casual or Military Wear, http://www.eurekalert.org/pub releases/2002-11/vt-era110702.php, Dated Nov. 7, 2002 2 Pages.

Smart Sensor Textiles Under Development, Future Pundit, http://www.futurepundit.com/archives/000595.html, Dated Nov. 11, 2002, 6 Pages.

Julie A. Soden, "Design and CAD Innovation in Woven Textile Research," Point Art and Design Research Journal, http://www.point.ac.uk/articles/jsoden.htm, Date unknown, Printed Apr. 15, 2003, 12 Pages.

Deborah Chandler, "Lesson 10 Double Weave," *Learning to Weave*, Interweave Press, 1995, 11 Pages.

Author Unknown, "Double Weave with an 8 Shaft Loom," http://www.cs.arizona.edu/patterns/weaving/webdocs/opr_8s.pdf, Date unknown, 13 Pages.

E. Rehmi Post and Maggie Orth, "Smart Fabric, or Washable Computing," Dated 1997, 5 Pages.

Sensatex, Sensatex SmartShirt System, www.sensatex.com/smartshirt, © 2002, Printed Apr. 14, 2003, 4 Pages.

Sensatex, "Sensatex Smart Textiles," www.sensatex.com/textiles, © 2002, 3 Pages.

Kevin Bonsor, "How Computerized Clothing Will Work," HowStuffWorks.com, Printed Apr. 17, 2003, 6 Pages.

* cited by examiner

PLURAL LAYER WOVEN ELECTRONIC TEXTILE, ARTICLE AND METHOD

This Application claims the benefit of U.S. Provisional Application Ser. No. 60/379,723 filed May 10, 2002, and of U.S. Provisional Application Serial No. 60/419,159 filed Oct. 17, 2002.

The present invention relates to a woven article and method, and, in particular, to a plural layer woven textile and/or article having an electronic circuit woven therein, and a method therefor.

In many fields of endeavor, from military to sport to apparel, a desire exists for electronic circuits to be incorporated into fabric and into articles that may be made of fabric. In some instances, such as electric blankets and electrically conductive fabric, electrically resistive and/or electrically conductive are been woven into fabric with insulating yarn to provide the desired resistance heating and/or conductivity characteristics. In these relatively simple arrangements, the characteristics of the resistive heating yarn determines the heating characteristics of the woven electric blanket and the conductivity of the electrically conductive yarn substantially determines the conductivity characteristic of the fabric. In other words, the number and size of electrically conductive yarn determine the conductivity of the fabric.

Apart from the aforementioned relatively simple arrangements, where electrical functionality of greater complexity has been desired, electrical circuits have been added to fabric after the fabric is woven. Among the approaches are the lamination of electrical circuit substrates to a fabric, e.g., as described in U.S. Patent Publication No. US 2002/0076948 of B. Farrell et al. entitled "Method of Manufacturing a Fabric Article to Include Electronic Circuitry and an Electrically Active Textile Article," and the embroidering and/or applique of electrical conductors and circuits onto a fabric, e.g., as described in U.S. Pat. No. 6,210,771 to E. R. Post et al. entitled "Electrically Active Textiles and Articles Made Therefrom" and in an article by E. R. Post et al. entitled "E-Broidery: Design and Fabrication of Textile-Based Computing" published in the IBM Systems Journal, Volume 39, Numbers 3 & 4, pages 840–860, 2000. In addition, an arrangement attaching electrical components to woven fabric including conductive yarn, such as by connecting the components to the conductive yarn by soldering and/or by electrically conductive adhesive, is described in U.S. Pat. No. 6,381,482 to Jayaraman et al. entitled "Fabric or Garment With Integrated Flexible Information Infrastructure."

In the aforementioned arrangements, the electrical electronic function is added after the fabric has been woven, e.g., by embroidery or by applique or by mechanical attachment, thereby adding additional steps and additional complexity to the manufacturing process. In addition, the particular arrangement thereof appears to be suited to one specific application or usage with corresponding specific manufacturing, and does not appear to lend itself to an efficient, relatively general manufacturing wherein the function and operation of the resulting fabric need not be specified or determined until after the fabric is woven, i.e. manufactured.

Accordingly, there is a need for a woven textile and article having an electronic circuit function woven therein.

To this end, the multilayer woven article of the present invention comprises warp yarn and weft yarn interwoven in a multilayer weave having plural layers defining at least one cavity therebetween, at least one electrically conductive yarn disposed in the warp and/or in the weft and having a portion thereof in one of the plural layers defining the at least one cavity, and a circuit carrier disposed in the cavity and having at least one exposed electrical contact in electrical connection with the at least one electrically conductive yarn, the circuit carrier including at least one electronic device for performing a function.

According to another aspect of the invention, a multilayer woven article comprises a plurality of electrically insulating yarn and electrically conductive yarn defining plural layers in the warp, a plurality of electrically insulating yarn and electrically conductive yarn in the weft interwoven in a multilayer weave with the plurality of electrically insulating yarn and electrically conductive yarn in plural layers in the warp, wherein an electrically conductive yarn in the warp crossing an electrically conductive yarn in the weft makes electrical connection therewith at the crossing thereof; and at least one electrically conductive yarn in the warp and/or in the weft woven into at least first and second ones of the plural layers for crossing at least one electrically conductive yarn in the other of the warp and/or weft without making electrical contact therewith.

BRIEF DESCRIPTION OF THE DRAWING

The detailed description of the preferred embodiments of the present invention will be more easily and better understood when read in conjunction with the FIGURES of the Drawing which include.

Figure 1A:
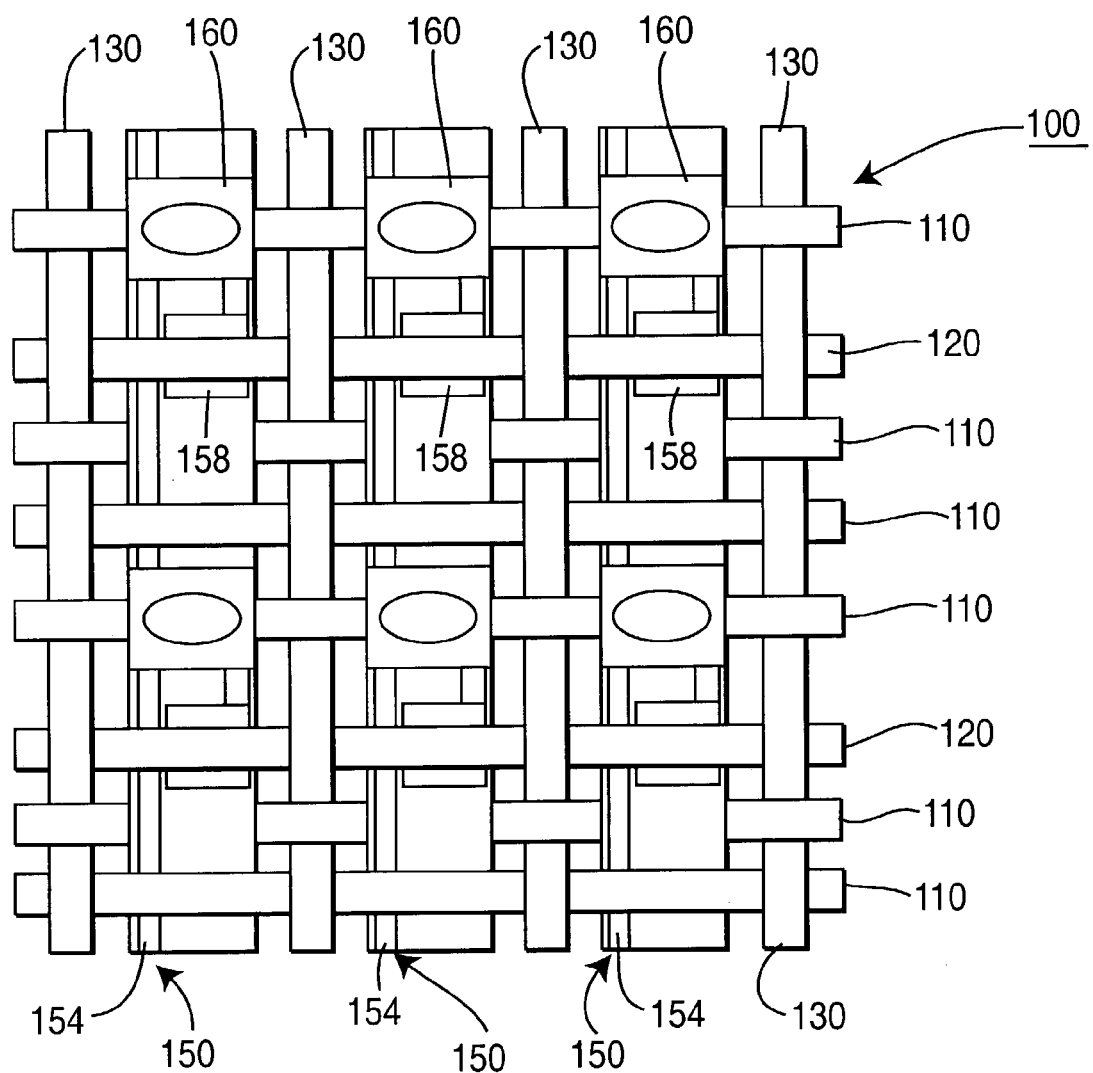
FIG. 1A is a plan view schematic diagram of an example woven fabric including an example embodiment of an electronic circuit therein.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. It is noted that, according to common practice, the various features of the drawing are not to scale, and the dimensions of the various features are arbitrarily expanded or reduced for clarity.

DESCRIPTION OF THE PREFERRED EMBODIMENT(S)

Woven textiles generally comprise two sets of relatively straight yarn, the warp and the weft, which cross and interweave to form a fabric. Typically, the warp and weft yarn cross at approximately a right angle as woven, but may cross at any angle. Also typically, fabric is woven to have a given width, but may have any desired length. The warp yarn runs in the length direction of the fabric, which is generally the longer dimension thereof, and the weft yarn runs in the crosswise or width direction thereof, which is generally the shorter dimension. With a modern computer controlled loom, the weaving process is performed automatically and may be responsive to weaving instructions described in computer instructions and/or derived from a computer aided design program. More complex weaves, such as a Leno weave in which a pair of warp yarn are intertwined in a series of figure eights with filling yarn, may employ more than two sets of yarn and/or other than a plain weave in the warp and/or weft, are readily made by such modern looms.

A textile and/or fabric may be woven in a single-layer weave and/or in a plural-layer weave. It is noted that textiles and/or fabrics having two or more layers, i.e. plural layers, are commonly and generally referred to as multilayer weaves. Certain weaves may be referred to specifically, e.g., a two-layer woven fabric may be referred to as a double weave. Double and other multilayer weaving is conventional and is described in many publications, e.g., D. Chandler, *Learning to Weave*, Interweave Press, 1995, Lesson 10, "Double Weave."

In a plural layer (multilayer) weave, warp yarn are designated as being in one of two or more layers and the weft yarn is interwoven with warp yarn in any one or more layers, so as to weave fabrics having other than a single-layer sheet-like construction. One or more layers, tubes, pockets, cavities, or other complex woven structures may be provided utilizing multilayer weaving, e.g., by providing one or more regions wherein two overlying layers of weave are not interwoven in the region(s) and the one or more regions are interspersed among and surrounded by regions wherein the multiple layers are interwoven. Any and all of such regions wherein plural layers are not interwoven may be referred to as "pockets" for simplicity, or generically and formally as "cavities."

The yarn, which is typically long, flexible and relatively thin, is selected to provide the desired strength, wear, laundering, durability and other requirements of the end use to which the fabric is intended to be put. Where ones of the warp and/or weft yarn are electrically conductive, the woven fabric may function in a manner akin to an electrical circuit board, i.e. the electrically conductive yarn provide electrical connections between various locations of the woven fabric, and/or to locations external to the fabric, and/or with electrical and/or electronic components embodied in the fabric, as may be desired.

The embodiments of woven textile and/or fabric herein generally include a carrier including an electronic circuit for performing all or part of an electronic function. Examples of such carriers include circuit carriers, also referred to as carriers, modules or "circuit tablets" in some cases, and "functional yarn."

A circuit carrier is a relatively compact part including one or more electronic parts and/or devices and interconnections therebetween, and that also has one or more exposed contacts at which electrical connection to conductive yarn in a textile or fabric may be made. One or more circuit carriers may be placed into cavities formed in a woven textile or fabric, e.g., as by weaving a pocket, tube, or other cavity by plural layer or multilayer weaving. The arrangements herein include circuit carriers in a woven textile or fabric that has one or more electrically conductive yarn in the warp and/or the weft.

Another example of a circuit carrier is referred to herein as a "functional yarn" which may be in the warp and/or the weft, but is typically in the weft. Functional yarn includes an elongated electrical and/or electronic substrate on which are disposed one or more electrical conductors and a plurality of electrical and/or electronic devices that connect to one or more of the electrical conductors. In other words, a functional yarn is any electrical and/or electronic substrate that includes electrical conductors and electrical and/or electronic devices that perform an electrical and/or electronic function, wherein the substrate may be utilized as a yarn and woven.

Figure 1B:
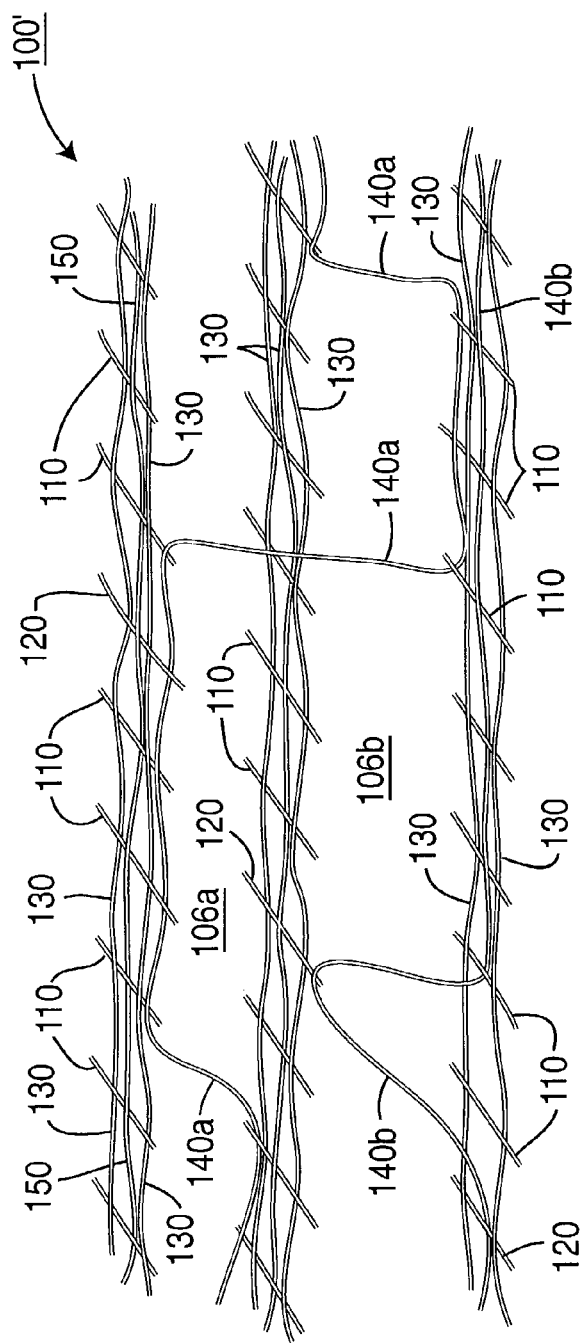
FIG. 1B is an isometric schematic view of a portion of an example multilayer woven fabric including an example embodiment of an electronic circuit therein.
Figure 2:
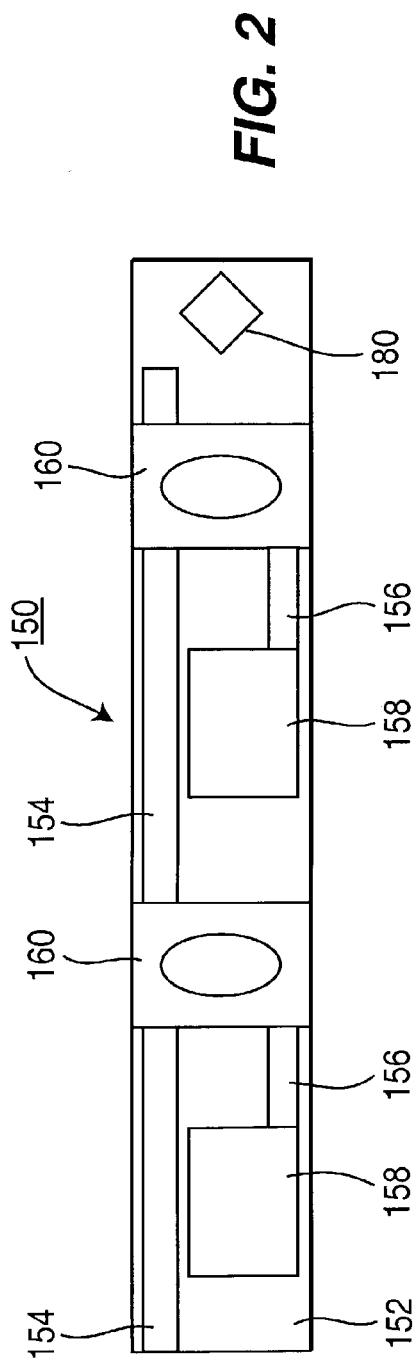
FIG. 2 is a plan view schematic diagram of a yarn including an example electronic circuit function, as for the woven fabric of FIGS. 1A and 1B.

FIG. 1A is a plan view schematic diagram of an example woven fabric 100 including an example embodiment of an electronic circuit, and FIG. 2 is a plan view schematic diagram of a yarn 150 including an example electronic circuit function, as for the woven fabric of FIGS. 1A and 1B. Fabric 100 is a plain weave fabric including insulating yarn 110 and electrically conductive yarn 120 in the warp and insulating yarn 130 and functional yarn 150 in the weft. Fabric 100 may also include electrically conductive yarn in the weft. Insulating yarn 110 are disposed between adjacent electrically conductive yarn 120 in the warp to provide an insulating separator therebetween and insulating yarn 130 are disposed between adjacent functional yarn 150 (and/or electrically conductive yarn, if any) in the warp to provide an insulating separator therebetween.

FIG. 1B is an isometric schematic view of a portion of an example multilayer woven fabric 100' including an example embodiment of an electronic circuit. Example fabric 100' is a multilayer weave fabric, specifically a three-layer weave, including, e.g., insulating yarn 110 and electrically conductive yarn 120 in the warp of each of layers 101 and 103, and including, e.g., insulating yarn 130, electrically conductive yarn 140 and functional yarn 150 in the weft. Example layer 102 includes insulating yarn 110, 130 in the warp and weft so as to provide an insulating separation between the conductive yarn 120, 140 disposed in layers 101 and 103. Layer 102 may include electrically conductive yarn 120 and/or functional yarn 150 in the warp, but electrically conductive warp yarn 120 and/or functional yarn 150 may be included only where not proximate conductive warp yarn 120 in either or both of layers 101 and/or 103 so as to avoid short circuits. Example fabric 100' may include functional yarn 150 in the warp and/or in the weft. Insulating yarn 110 are disposed between adjacent electrically conductive yarn 120 in the warp to provide an insulating separator therebetween and insulating yarn 130 are disposed between adjacent functional yarn 150 and/or electrically conductive yarn 140 in the warp to provide an insulating separator therebetween.

Ones of the weft yarn, e.g., ones of weft yarn 130, 140, 150, are interwoven with ones of warp yarn 110, 120 (and with ones of warp functional yarn 150, if any) in warp layers 101, 102, 103, to weave a multilayer fabric. In the fabric portion illustrated, one warp yarn 140*a* is interwoven with layers 101, 102 and 103 and another warp yarn 140*b* is interwoven with layers 102 and 103. The combination of multilayer interwoven electrically conductive yarn 120 and/or functional yarn 150 in the warp and electrically conductive yarn 140 and/or functional yarn 150 in the weft provide a multilayer structure having electrical conductors and/or functions on one or more layers, thereby to provide an electrical structure somewhat analogous to the structure of a multilayer laminated electronic printed circuit board.

It is noted that while known electrically conductive yarn is completely uninsulated, partially insulated electrically conductive yarn could be employed in the textiles, fabrics and/or articles described herein, wherein the uninsulated portions thereof are woven to be in locations whereat electrically connection is to be made thereto, e.g., at crossings of other electrically conductive yarn and/or of functional yarn to which electrical connection is to be made. As used herein, the terms electrically conductive yarn and uninsulated electrically conductive yarn are used interchangeably to refer to electrically conductive yarn that is completely or partially uninsulated.

Interweaving of plural adjacent weft yarn, typically insulating yarn 130 and electrically conductive yarn 140 between two or more warp layers 101, 102, 103, can be woven to form pockets, tubes or recesses, e.g., as suggested by cavities 106*a*, 106*b*, into which circuit carriers may be placed. Preferably, cavities 106 are woven to be closed pockets and the circuit carriers are inserted into the pockets during the weaving process and are enclosed therein as the pockets are woven, as described below. Typically, adjacent layers are interlocked by weft yarn 130, 140, however, they can be woven as separate layers, as they are to form a cavity or pocket as described. An external or surface layer wholly of insulating yarn may be woven as an outer layer so as to provide insulation of the conductive yarn 120, 140 and functional yarn 150 included in the inner (enclosed or internal) layers.

Functional yarn 150 of FIG. 2 includes plural electrical conductors 154, 156, 158 and an electronic device 160 on an insulating electrical or electronic substrate 152. In the specific example of FIGS. 1 and 2, electronic device 160 is a light emitting diode (LED) 160 that emits light in response to electrical signals applied thereto. Substrate 152 is an elongate strip of flexible insulating material, e.g., a polyimide or polyester or other material suitable for use as an electrical substrate. Conductors 154–158 are formed on substrate by any suitable means, such as by etching a conductive metal layer, e.g., copper layer, attached to substrate 152 using known methods for making flexible electrical printed circuits and the like. As illustrated, conductor 154 extends substantially the length of substrate 152 to provide a common connection to all of the LEDs 160 thereon, and an electrical signal for activating LEDs 160 is applied thereto. Conductor 158 provides an electrical contact 158 to which an electrical signal for activating LED 160 is applied, and each contact 158 is connected to a corresponding LED 160 by a conductor 156.

Electrical connection between electrically conductive yarn 120 in the warp and functional yarn 150 and/or electrically conductive yarn in the weft is satisfactorily made by the physical contact therebetween in a plain weave having a typical tightness and/or density of yarn, without any mechanical attaching thereof. Optionally, the electrical connection provided by physical contact, e.g., frictional contact, may be supplemented, e.g., by a mechanical attaching such as a spot of electrically conductive adhesive or solder, at each connection 158. For proper electrical contact, functional yarn 150 is registered so that contacts 158 thereon each underlie a conductive yarn 120 where they cross. To this end, functional yarn 150 may include one or more registration marks or indicia 180 at one end thereof so that the loom may sense the position thereof in the weaving process to provide proper registration.

Optionally, conductor 154 and/or contacts 158 may be coated with an insulating coating, except at locations where an electrical connection is to be made thereto. Also optionally, conductor 154 and/or contacts 158 may have a spot of electrically conductive adhesive applied at locations where an electrical connection is to be made thereto, e.g., at the terminal locations for LEDs 160 and/or at intersections with conductive yarn 120. LEDs 160 may be connected to substrate 152 by any suitable means, e.g., by soldering or electrically conductive adhesive.

Each LED 160 is illuminated by applying a suitable electrical signal between common conductor 154 and the contact 158 associated with the LED. In fabric 100, each conducting yarn 120 intersects functional yarn 150 to overlie one of the contacts 158 thereof. Thus, each LED 160 has one terminal that is connected via contact 158 to a conductive yarn 120 that is accessible at an edge of fabric 100 and has a terminal connected to conductor 154 that is accessible at another edge of fabric 100, and so each LED 160 may be activated by applying an electrical signal to the appropriate ones of conductive yarn 120 and conductors 154. LEDs 160 of fabric 100 are in aggregate an addressable passive-matrix display having row conductors 120 and column conductors 154 by which any one or more of LEDs 160 may be addressed. Alternatively and optionally, a current-limiting resistor R could be provided for each LED 160 or for groups of LEDs 160, of functional yarn 150.

Fabric 100 as described is a woven passive-matrix display wherein any pattern of the LEDs 160 may be illuminated by applying appropriate electrical signals between selected ones of conductors 120 and 154. However, with additional conductors and/or electronic devices on functional yarn 150, an active-matrix display and/or a non-matrix display and/or a display having individually addressable pixels (LEDs) may be provided, as described below. Thus, LEDs 160 or any other electronic devices 160 may be energized and/or operated in a programmed pattern and/or sequence, e.g., to provide an alphanumeric or other character display, or a pixilated display, or to provide a sensor array fabric that sequentially senses different agents and/or processes the sensed data.

It is noted that in an actual application, e.g., a textile or textile article, fabric 100 would likely be much larger and would contain many more yarn of one or more types in both warp and weft, and functional yarn 150 would likely be much longer and contain many more LEDs 160. Thus, FIGS. 1 and 2, as well as other FIGURES herein, may be considered as illustrating a portion of a fabric or a portion of a functional yarn.

Suitable insulating yarn includes, for example, but are not limited to, yarn and/or thread and/or fiber of cotton, wool, silk, linen, flax, silk organza, synthetics, plastic, polyester, and the like, whether fiber, thread, monofilament, multistranded, spun, twisted or otherwise constructed, as may or may not be conventional.

Suitable electrically conductive yarn includes, for example, but is not limited to, copper, steel, stainless steel, nickel, silver, gold and/or other metal threads, whether single filament or plural stranded, twisted or braided or a wire or a flat strip, combinations of conductive metal and insulating threads and/or strands, electrically conductive plastics, and the like. One suitable electrically conductive yarn is Aracon® yarn which comprises one or more strands or threads of a metal-coated Kevlar® polymer and is commercially available from E. I. duPont de Nemoirs and Company of Wilmington, Del. Aracon® yarn can have an electrical conductivity approaching that of copper, e.g., about $10^{-3}$ Ohm/cm. Other suitable conductive yarn include metal-wrapped yarns and metal-plated yarn, and the like.

FIGS. 3A through 3D are plan view schematic diagrams of example embodiments of yarns 150a, 150b, 150c, including an example electronic circuit function suitable for a woven fabric as illustrated in FIGS. 1A and 1B.

Figure 3A:
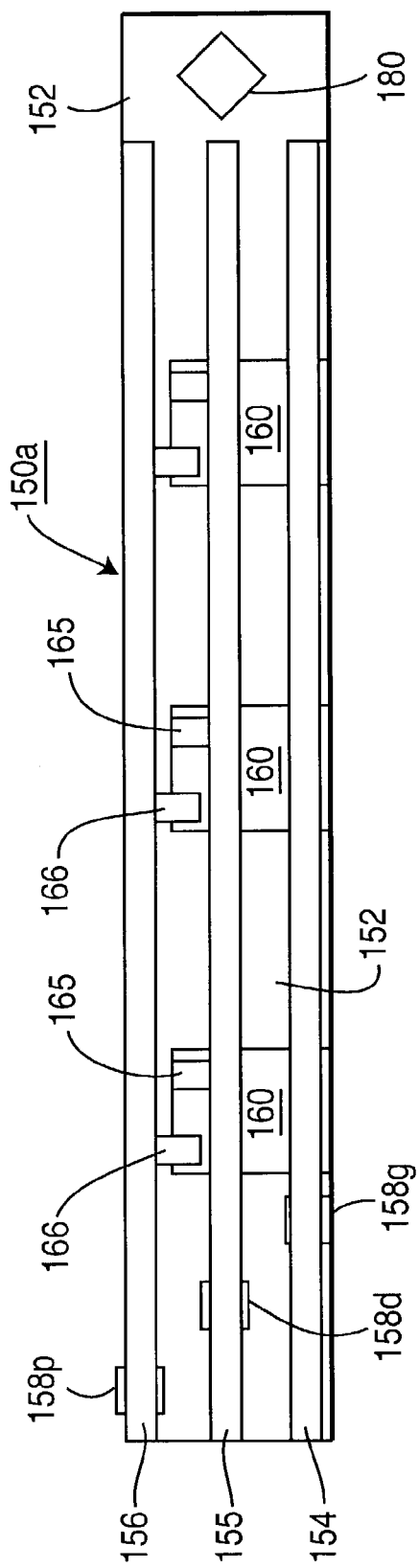
FIGS. 3A through 3D are plan view schematic diagrams of example embodiments of yarns including an example electronic circuit function suitable for a woven fabric as illustrated in FIGS. 1A and 1B.

FIG. 3A is a plan view schematic diagram of a yarn 150a including another example electronic circuit function, as for the woven fabric of FIGS. 1A and 1B. Functional yarn 150a includes plural electrical conductors 154, 155, 156 and an electronic device 160 on an insulating electrical or electronic substrate 152. In this specific example, electronic device 160 is a sensor, such as a temperature sensor. Substrate 152 is an elongate strip of insulating material, e.g., a polyimide or polyester or other material suitable for use as an electrical substrate.

Functional yarn 150a is viewed from the "back" as if substrate 152 is transparent so that conductors 154, 155, 156 on the front surface thereof, and sensors 160 attached thereto, are visible. Conductors 154–156 are formed on substrate 152 by any suitable means, such as by etching a conductive metal layer, e.g., copper layer, attached to substrate 152 using known methods for making electrical printed circuits and the like. As illustrated, each of conductors 154, 155 and 156 extend substantially the length of substrate 152 to provide three common connections to all of the sensors 160 thereon. Conductor 154 provides a common or ground connection, conductor 156 provides via contacts 166 a connection for electrical power for each sensor 160. Conductor 155 provides a conductor and contact 165 for applying an electrical signal for activating and/or reading sensor 160 and for receiving an electrical signal comprising data or information read from sensor 160.

Electrical connection between electrically conductive yarn 120 in the warp and conductors 154, 155, 156 of functional yarn 150a and/or electrically conductive yarn in the weft is satisfactorily made by the physical contact therebetween in a plain weave having a typical tightness and/or density of yarn, and may be supplemented, e.g., by a spot of electrically conductive adhesive at each connection 158. For proper electrical contact, functional yarn 150a is registered so that contacts 158g, 158d, 158p thereon each underlie a respective conductive yarn 120 where they cross. To this end, functional yarn 150a may include one or more registration marks or indicia 180 at one end thereof so that the loom may sense the position thereof in the weaving process to provide proper registration.

Optionally, conductors 154, 155 and/or 156 may be coated with an insulating coating, except at locations 158g, 158d, 158p to define contacts 158g, 158d, 158p where an electrical connection is to be made thereto. Also optionally, contacts 158g, 158d, 158p may have a spot of electrically conductive adhesive applied for making an electrical connection is to be made thereto., e.g., at intersections with conductive yarn 120. Sensors 160 may be connected to substrate 152 by any suitable means, e.g., by soldering or electrically conductive adhesive.

Electronic device 160 is preferably an addressable sensor which has a unique identification or address and which, when signaled by a data signal including such identification and/or address via its data terminal 165, performs a particular function. The function performed may be as simple as sensing a presently existing condition, such as temperature, or recording a given condition over a time period, whether for a given period or until again signaled, or may be more complex, such as providing processed data relating to a sensed condition. Each sensor 160 is powered by electrical power applied between ones of conducting yarn 120 connected to conductors 154 and 156 of functional yarn 150a and is activated by applying a suitable electrical addressing signal between common conductor 154 and data conductor 155, i.e. between two conducting yarn 120. One example of a suitable addressable sensor is type DS18B20X temperature sensor and/or thermostat flip-chip integrated circuit and the like available from Dallas Semiconductor—Maxim Integrated Products, Inc. located in Sunnyvale, Calif.

In a fabric 100, each conducting yarn 120 intersects functional yarn 150a to overlie one of the contacts 158 thereof. Thus, each sensor 160 has terminals that are connected via contacts 158g, 158d, 158p to a conductive yarn 120 that is accessible at an edge of fabric 100, so that all of sensors 160 on all of functional yarn 150a of fabric 100 are accessible from a single edge of fabric 100. In addition, where conductive yarn 120 are in the warp and functional yarn 150a are in the weft, fabric 100 may be woven to any desired length and be connected at one edge in the same format, e.g., at a single interface that may be standardized. Alternatively, fabric 100 may be cut into any desired length and each length may be connected via the standardized interface. Also alternatively, conductors 154, 155, 156 may be continuous over substantially the length of functional yarn 150a in which case only three conductive yarn 120 may be necessary to address addressable sensors 160, or conductors 154, 155, 156 may be discontinuous over the length of functional yarn 150a in which case more than three conductive yarn 120 may be necessary to address sensors 160.

Thus, sensors 160 of fabric 100 are in aggregate an addressable sensor matrix display having conductors 120 available at a single edge by which any one or more of sensors 160 may be addressed. It is noted that in an actual application, e.g., a textile or textile article, fabric 100 would likely be much larger and contain many more yarn of all types in both warp and weft, and functional yarn 150 would likely be much longer and contain many more sensors 160. Thus, FIGS. 1A and 1B, as well as other FIGURES herein, may be considered as illustrating a portion of a fabric or a portion of a functional yarn.

Circuit carriers, connectors and/or batteries and/or other components needed to connect with and/or operate fabric 100 may be attached to or incorporated into fabric 100, e.g., in cavities 106 woven therein and/or at an edge or edges thereof and/or at another convenient location. Examples of such components include, for example, decoders and/or drivers for LEDs, and/or for one or more rows and/or columns of LEDs, however, such components are preferably disposed on functional yarn 150.

Alternatively and optionally, electronic devices 160 may be of the sort that derive their operating power from the data and/or signals on the data conductor 155. Alternatively, electronic devices 160 may be powered via power conductor 156 by superimposing the data and/or signals on the power signal. One example of a sensor device 160 suitable for such arrangement is the type DS18B20X temperature sensor available from Dallas Semiconductor—Maxim Integrated Products, Inc. Thus, a functional yarn 150a may be, for example, a two-conductor equivalent of the three-conductor functional yarn 150a of FIG. 3A. Other addressing arrangements, e.g., those requiring more than three conductors, such as the I²C scheme which requires a clock signal conductor, may also be employed.

Figure 3B:
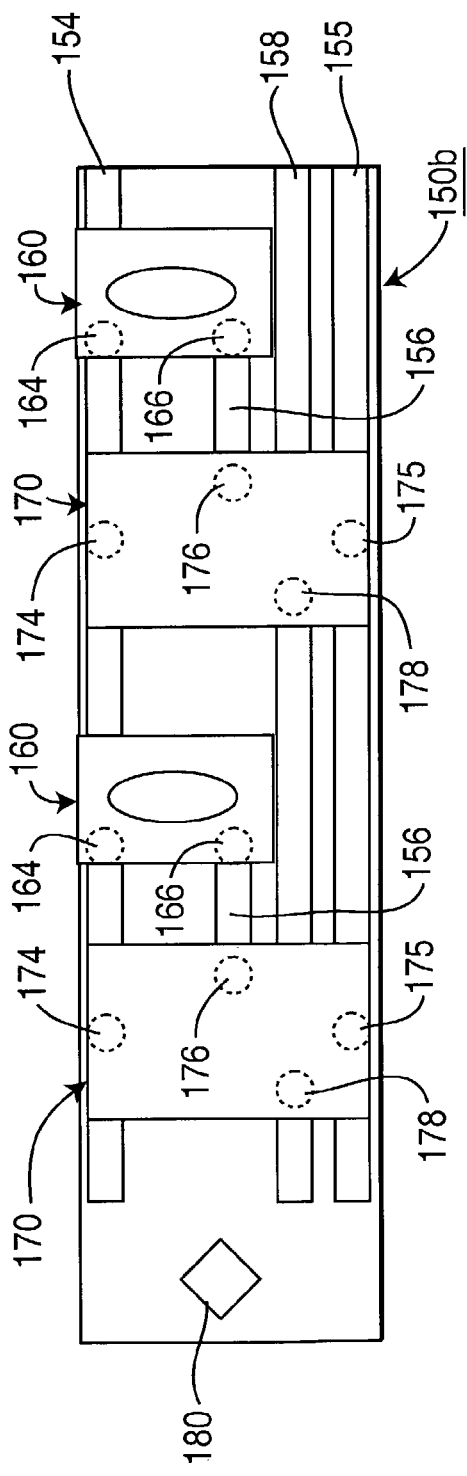

FIG. 3B is an example embodiment of a functional yarn 150b which includes additional electronic devices 170 on functional yarn 150, as may be employed to provide a woven non-matrix display having individually addressable pixels (LEDs) 160. Extending substantially the length of substrate 152 is conductor 154 connecting to all of the devices 160 at terminal 164 thereof and to electronic devices 170 at terminal 174 thereof, e.g., for providing a ground connection. Extending substantially the length of substrate 152 is conductor 158 connecting to all of electronic devices 170 at terminal 178 thereof, e.g., for providing a power connection. Also extending substantially the length of substrate 152 is conductor 155 connecting to all of electronic devices 170 at terminal 175 thereof, e.g., for providing a data signal thereto for addressing electronic devices 170 for selectively applying electrical power from conductor 158 to terminal 168 of LED 160 via output terminal 176 and conductor 156. As above, functional yarn 150b may include one or more registration indicia 180.

Electrical power is thus applied to all of electronic devices 170 via power conductor 158 and is selectively applied to ones of electronic devices 160 via the ones of electronic devices 170 that are addressed by the addressing signals, e.g., serial addressing signals, provided via data conductor 155. Electronic device 170 is preferably an addressable switch which has a unique identification or address and which, when signaled by a data signal including such identification and/or address via its data terminal 175, performs a particular function. The function performed may be as simple as making or breaking a connection between two of its terminals 176 and 178, whether for a given period or until again signaled, or may be more complex, such as providing a width-modulated or time modulated or a frequency signal at or between one or more of its terminals.

In a functional yarn 150b for a simple non-scanned, non-matrix array of light-emitting pixels, the state of each pixel may be set by addressing the appropriate switch and setting its state, e.g., either "on" or "off," to set the state of the pixel to either "on" or "off." One example of a suitable addressable switch is type DS2406 available from Dallas Semiconductor—Maxim Integrated Products, Inc. located in Sunnyvale, Calif. Alternatively, addressable switch 170 has plural controllable outputs for controlling plural electronic devices 160. In one embodiment, addressable switch 170 has seven outputs, as would be convenient for addressing a seven-segment LED display for displaying the numbers 0–9.

Such functional yarn 150b and a woven fabric display including same, employs serial addressing and is suitable for displaying still images and/or text or character messages. A fabric display may also be utilized for displaying moving images, e.g., video-rate displays, if sufficient addressing bandwidth or parallel addressing is available. Because an LED is emissive, it can produce a display that is not only easily seen in the dark, but may also be seen in daylight.

Figure 3C:
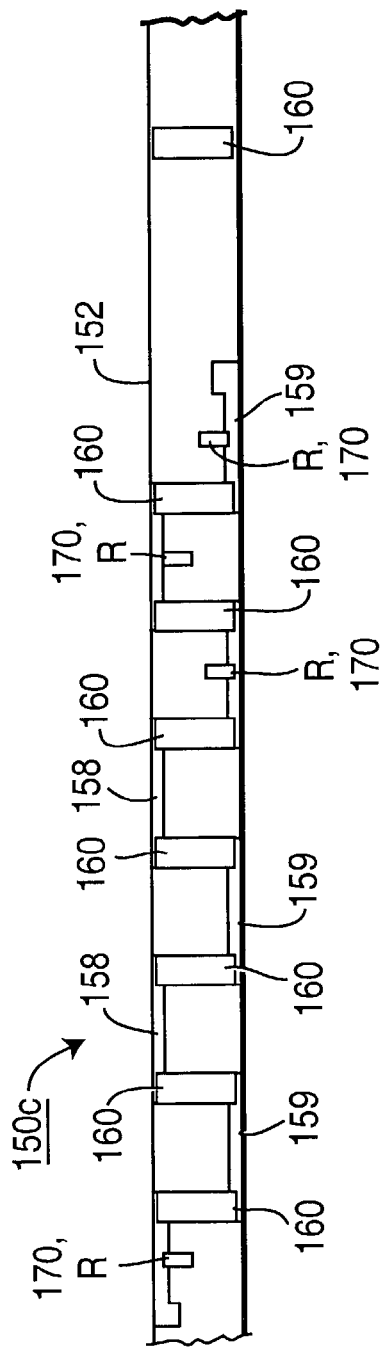
Figure 3D:
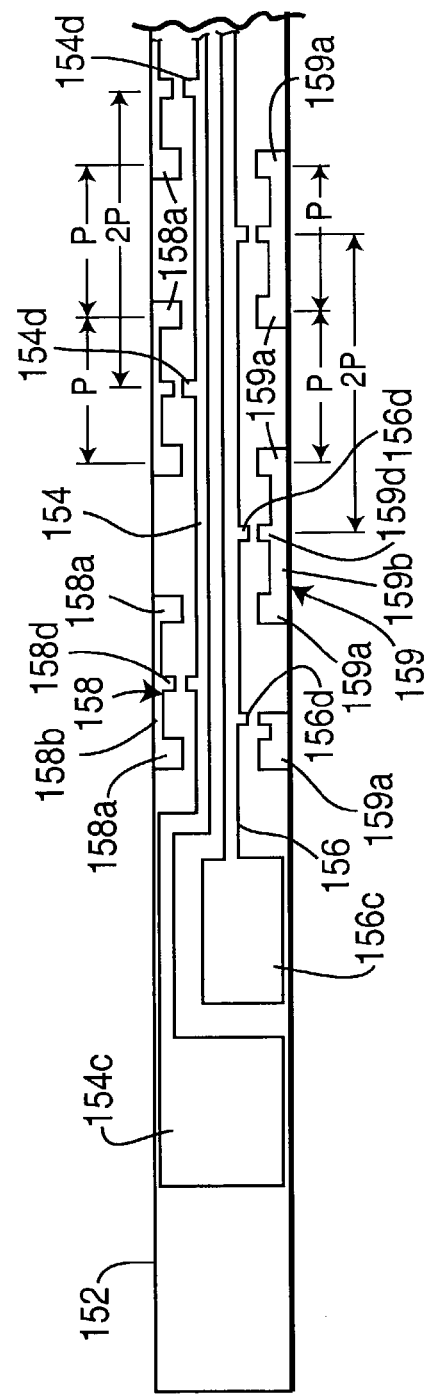

FIGS. 3C and 3D are an example embodiment of a functional yarn 150c which includes power and ground conductors 154, 156, various resistors R, and electronic devices 160 on functional yarn substrate 152, as may be employed to provide a woven non-matrix display having a pattern of electronic devices 160, e.g., LEDs 160, thereon. In particular, functional yarn 150c has a yarn substrate 152 that may be utilized with various different ones of devices 160 and resistors R attached thereto, e.g., in various serial and/or parallel circuits, as may be advantageous for making a unique and/or a specialized functional yarn. A portion of yarn substrate 152 is shown in FIG. 3D without electronic devices 160 and resistors R mounted thereon.

Spaced apart at a pitch 2P along the opposing edges of substrate 152 are conductor patterns 158 and 159 having respective contacts 158a, 158d and 159a and 159d to which electronic devices 160 and resistors R may be connected. Spaced apart at a pitch P along the opposing edges of substrate 152 are pairs of contacts 158a, 159a of patterns 158, 159 to which electronic devices 160 may be attached. Alternating adjacent pairs of contacts 158a are connected to each other by a conductor 158b which includes a contact 158d extending away from the edge of substrate 152, and alternating adjacent pairs of contacts 159a are connected to each other by a conductor 159b which includes contact 159d extending away from the edge of substrate 152. Conductors 158b, 159b are typically disposed alternatingly with respect to the pairs of contacts 158a and 159a so that plural devices 160 may be connected in series, if desired, and so that contacts 158d and 159d alternate at a pitch 2P.

Extending substantially the length of substrate 152 of functional yarn 150c in a central region thereof is conductor 154 providing a plurality of contacts 154d at which a connection, e.g., to ground, may be made via conductor 154. Also extending substantially the length of substrate 152 in the central region thereof is conductor 156 providing a plurality of contacts 156d at which a connection, e.g., to a source of power, may be made via conductor 156. Contacts 154d and contacts 156d are typically spaced apart at a pitch 2P and are disposed so as to be proximate respective ones of contacts 158d and 159d so that electronic devices 170, such as resistors R, may be mounted therebetween. Near one or both ends of functional yarn 150c are contacts 154c and 156c for respectively connecting conductors 154 and 156 to external circuits, such as to sources of power and ground potential. Conductors 154, 156, 158, 159 and the contacts thereof are typically an etched copper pattern on an insulating substrate 152, and may be covered by an insulating coating other than at the various contacts thereof.

In the example embodiment illustrated in FIG. 3C, the five electronic devices 160 (e.g., LEDs) at the left of the FIGURE are connected in series via ones of conductor patterns 158, 159 and the series connected devices 160 are connected to conductors 154 and 156 via two resistors R which are of ohmic value selected for a desired value of current flow through devices 160 with a specified value of potential applied between conductors 154, 156. Because there are two resistors R in series with the series connected devices 160, the necessary resistance value may be divided between the two resistors R in any desired proportion. Typically, one resistor R is of low ohmic value (e.g., 1 ohm) to serve as a jumper between one pair of connections 154d, 158d or 156d, 159d, and the other resistor R is a higher ohmic value (e.g., 100 ohms) connected between another pair of connections 154d, 158d or 156d, 159d, to determine the level of current flow through devices 160.

In an example embodiment of a functional yarn 150c, substrate 152 has a length of about 40 cm and a width of about 4 mm and is of a polyimide material. Series connections of between one and five LEDs 160 are provided, with contacts 158a, 159a each being about 1 mm by 2 mm in area and repeating at a pitch of about 9.5 mm. Contacts 154d, 156d, 158d and 159d are each about 0.5 mm by 0.5 mm, and are separated by a gap of about 0.6 mm. LEDs 160 operate at a current of about 20 milliamperes with about 12 volts is applied between conductors 154 and 156. For five LEDs 160 connected in series, a 1-ohm resistor R and a 100-ohm resistor R are utilized, whereas for a lesser number of LEDs 160 in series a higher value resistor R is utilized. Where two series circuits of LEDs 160 draw current through the same resistor R, the value of that resistor R is reduced proportionately so that about 20 milliamperes flows in each of the two series circuits of LEDs 160. A number of functional yarn 150c each having a different predetermined pattern of LEDs 160 mounted thereto were woven into the weft of an about 1.35 m by 0.37 m (about 53 inch by 14.5 inch) banner sign wherein the LEDs 160 when illuminated formed characters and/or symbols spelling out a message, e.g., "Wonders Never Cease." Conductive yarn of braided copper was woven into the warp thereof to make frictional electrical connection to contacts 154a, 156a of each functional yarn 150c for applying the 12 volt operating potential and ground potential thereto. Insulating yarn provides a desired spacing of the conductive yarn and the functional yarn 150c in the warp and weft of the woven sign.

LEDs 160 are caused to illuminate by applying suitable potential between the terminals thereof, thereby to illuminate one or more LEDs 160 of a functional yarn 150 individually, as a group and/or as a strip, and brightness may be selected by suitably selecting the potential applied and/or the current that flows. Suitable LEDs for functional yarn include those available from Nichia Corporation of Japan, and from other sources, which may include LEDs producing "white" as well as other colors of light, such as red, green, blue, amber and/or a combination thereof, as well as LEDs that are switchable between two or more colors.

Examples of electrical and/or electronic devices and/or components that may be included on a functional yarn include, for example, but are not limited to, sensors of temperature, chemicals, force, pressure, sound, an electric field, a magnetic field, light, acceleration and/or any other condition, sources of light, force, heat, electromagnetic radiation and/or sound, infra red and/or wireless transmitters and/or receivers, imagers, CCD imagers, thermoelectric sensors, coolers, heaters and/or generators, liquid crystal elements, electro-luminescent elements, organic light-emitting elements, OLEDs, electrophoretic materials, LEDs, piezo-electric elements and/or transducers, microphones, loudspeakers, acoustic transducers, resistors, processors, digital signal processors, microprocessors, micro-controllers, CPUs, analog-to-digital converters, digital-to-analog converters, a data-producing device, a data-utilizing device, a processing device, a switch, a human-interface device, a human-input device, a blinker and/or flasher, a battery, a fuel cell, a solar cell, a photovoltaic device, a power source, and so forth. Any one or more or all of such devices may be activated by simply applying electrical power thereto, whether via one or more conductors, and/or may be actively addressable in response to an addressing signal applied thereto.

Typically, one or more conductors on a functional yarn serve to conduct electrical power and/or ground potential to electronic devices thereon, and one or more other conductors may serve to conduct data to or from such devices. Sources of electrical power connected to various conducting yarn and/or functional yarn include one or more batteries, solar cells, photovoltaic devices and/or other power sources, either external to the fabric and/or attached to the fabric and/or to a functional yarn.

One or more data and/or signal conductors may communicate data and/or signals to and/or from one or more external sources and/or electronic devices on functional yarn, and/or may communicate data and/or signals between electronic devices on functional yarn. All electronic devices on a functional yarn need not be of the same or like kind. For example, a combination of sensors and processors may be included on one or more functional yarn, whereby data is may be collected, sensed, distributed and/or processed within a functional yarn and/or plural functional yarn of a woven fabric. Thus, electronic devices on a functional yarn may be networked together and/or may be networked with other electronic devices on another functional yarn or external to the fabric.

Typically, functional yarn is slit or cut from a sheet of a polyimide or polyester or other polymer material and is about 0.2 to 0.5 mm in width and about 0.01 to 0.25 mm thick, but the material may be wider or narrower and/or thicker or thinner. Other suitable sizes for the functional yarn may be in the range 0.3 to 3 mm in width and about 75 to 125 μm thick. For example, an about 1 mm wide and about 0.1 mm thick functional yarn has been found satisfactory for weaving 0.1–0.4 meter wide fabric. On an automatic loom, e.g., such functional yarn can be inserted into the weft by a standard rapier loom. If the functional yarn is to be woven in the weft of a fabric, then it is as long as the width of the fabric, and if the functional yarn is to be woven in the warp of a fabric, then it is as long as the length of the fabric or longer. Although functional yarn may be similar to a conventional slit-film yarn in that it is slit from a sheet of material, it differs substantially in that conventional slit-film yarn does not include any electrical and/or electronic device and/or functionality as described herein.

It is noted that the functional yarn may be fabricated as a sheet or panel of electrical substrate having electrical conductors formed thereon or applied thereto, and having electrical and/or electronic devices attached and/or applied thereon, which sheet or panel is then cut or slit or otherwise separated into individual functional yarn. For example, a sheet of polyimide, polyester or other plastic suitable for use as an electrical substrate, has a layer of conductive material thereon that is patterned, e.g., as by photo-etching, to form the electrical conductors for power, ground, data and the like as desired. Alternatively, the conductor pattern could be printed with an electrically conductive ink or epoxy or adhesive. Typically, electronic devices are attached as flip-chip and/or surface mount devices. If electronic devices are to be connected using solder or conductive adhesive, then balls of solder or conductive adhesive may be deposited on the conductors in the positions where the terminals of the electronic devices are to connect. The electronic devices are then placed on the substrate and connected via their terminals to the substrate. A coating, e.g., an epoxy or "glop-drop" or "glob-drop" coating, or an insulating film, may be applied thereover to additionally secure the electronic devices to the substrate and/or to smooth any edges or projections that might snag or otherwise interfere with the weaving process. An underfill encapsulation may also be employed. The sheet substrate is then slit or otherwise cut into strips, or is cut in a serpentine pattern, wherein each strip is a length of one or more functional yarn having electrical conductors and electronic devices thereon. Typically, the length of each strip is the length of one functional yarn, but may be a multiple thereof.

Functional yarn may also be fabricated as a strip or roll of electrical substrate having electrical conductors formed thereon or applied thereto, and having electrical and/or electronic devices attached and/or applied thereon to provide a functional yarn, which strip or roll may include plural functional yarn and is then slit to separate individual lengths of functional yarn or may include a single width of functional yarn and so need not be cut or slit or otherwise separated into individual functional yarn. Electrical conductors are formed on the strip and electronic devices connected thereon in like manner to that described above. Each strip or roll of functional yarn contains many lengths of functional yarn and is cut to the length of one functional yarn as fed to the loom for weaving. The functional yarn may be coated as above.

Figure 4A:
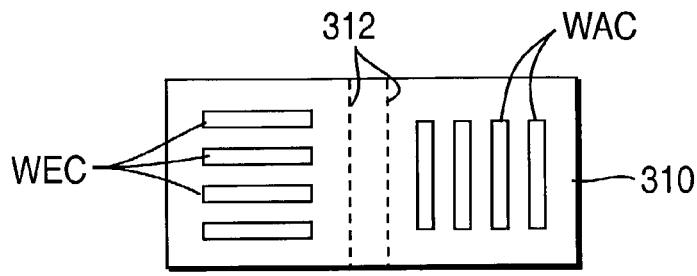
FIGS. 4A, 4B and 4C are plan view schematic diagrams of an example embodiment of a circuit carrier including an example electronic circuit function suitable for a woven fabric as illustrated in FIGS. 1A and 1B.
Figure 4B:
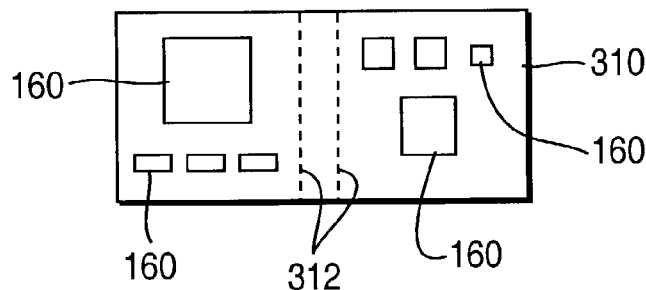
Figure 4C:
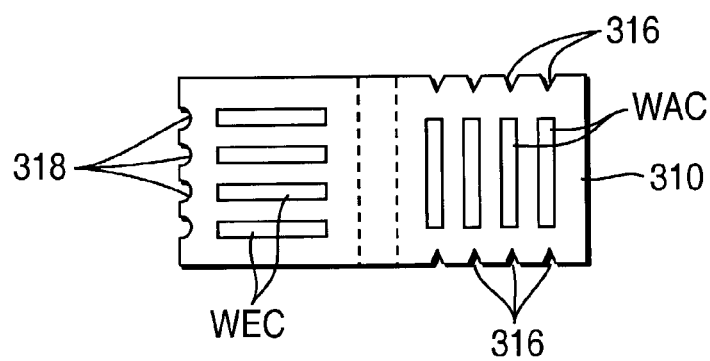
Figure 4D:
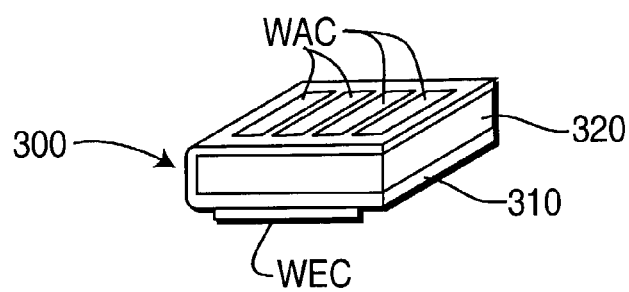
FIG. 4D is an isometric view thereof when folded.

FIGS. 4A, 4B and 4C are plan view schematic diagrams of an example embodiment of a circuit carrier 300 including an example electronic circuit function suitable for a woven fabric as illustrated in FIGS. 1A and 1B, and FIG. 4D is an isometric view thereof when folded. FIGS. 4A and 4B illustrate opposite sides of a generally rectangular substrate 310, e.g., a short strip of flexible printed circuit, that is folded at or near fold lines 312 into a "U"-shape so that the opposite ends of substrate 310 are substantially parallel, thereby to form carrier 300. Substrate 310 may be folded relatively sharply at or near fold lines 312 or may be folded to have a radius formed of the portion of substrate 310 between fold lines 312, as desired.

On one side (broad surface) of substrate 310 (FIG. 4A) near opposite ends thereof are respective carrier contacts WAC, WEC for contacting electrically conductive yarn 120, 140 in the warp and weft of a textile and/or fabric 100' into which carrier 300 is placed. While as little as one contact may be provided, typically plural contacts WAC and WEC are provided. Preferably, warp contacts WAC are substantially parallel rectangular contacts having a longer dimension in the direction along the length of the electrically conductive warp yarn 120. Parallel warp carrier contacts WAC are spaced apart a distance about the same as the distance between adjacent electrically conductive warp yarn 120 having one or more insulating warp yarn 110 therebetween. Also preferably, and similarly, weft contacts WEC are substantially parallel rectangular contacts having a longer dimension orthogonal to that of warp contacts WAC, i.e. weft contacts WEC are longer in the direction along the length of the electrically conductive weft yarn 140. Parallel weft carrier contacts WEC are spaced apart a distance about the same as the distance between adjacent electrically conductive warp yarn 140 having one or more insulating warp yarn 130 therebetween.

On the other side (broad surface) of substrate 310 (FIG. 4B) are mounted one or more electronic devices 160 for performing all or part of an electronic function. Electronic devices 160 may include integrated circuits, semiconductors, transistors diodes, sensors, active components, passive components and the like, as necessary and desirable for performing the desired electronic function, and may include any or all of the devices and functions described in relation to devices 160 and/or 170 herein. Typically, ones of electronic devices 160 are of different sizes and shapes, may be a surface mounted or flip chip type, e.g., using solder or electrically conductive adhesive, and usually, but not necessarily, comprise devices performing more complex functions, such as microprocessors, encoders and decoders, addressable drivers and/or switches, and the like. Typically, devices 160 are interconnected by metal conductors formed in a pattern on substrate 310 in any suitable manner, including as for a conventional printed circuit board. Connections through substrate 310 to contacts WAC, WEC may be made by conductive vias and/or by plated through holes and/or by any other suitable manner.

Substrate 310 with electronic device(s) 160 thereon is folded so that contacts WAC, WEC are exposed and devices 160 are enclosed, and preferably is filled and/or sealed with an encapsulant 320 to encapsulate electronic devices 160 and to maintain the surfaces of substrate 310 containing contacts WAC and WEC in substantially parallel relationship in carrier 300, as illustrated in FIG. 4D. Optionally, contacts WAC, WEC may be coated with an electrically conductive adhesive that is set during the weaving process, e.g., described below.

Typically, substrate 310 may be formed of a thin sheet of polyimide material with copper printed wiring conductors thereon, or of any of the materials described in relation to any other substrate. Typically, a number of substrates are fabricated on a sheet of substrate material, the electrical contact and conductor patterns are formed thereon, electronic devices 160 are mounted, and then individual or rows of substrates 310 are cut from the sheet thereof. Substrates 310 or rows of substrates 310 are then folded and encapsulated with encapsulant 320. Suitable encapsulants include Hysol brand encapsulants available from Henkel Loctite Corporation located in Industry City, Calif. Typical examples of carrier 300 may range in size from about 0.5×0.5×0.1 cm to about 2.5×2.5×1 cm, but may be larger or smaller, as may be necessary and/or desirable. Carriers 300 may be utilized, e.g., where an electronic device 160 is too large to conveniently be mounted to functional yarn 150.

Carriers 300 are placed into cavities in a multilayer fabric as the fabric is being woven, and the thread count precision and dimensions of the pocket are predetermined so that carrier 310 is a generally snug fit in the pocket, so that conductive yarn 120, 140 in the warp and in the weft align with sufficient precision so as to contact warp and weft contacts WAC and WEC, respectively. With proper yarn tension and weave density, the physical contact between conductive yarn 120, 140 and contacts WAC, WEC is sufficient to provide reliable electrical connection therebetween. If desired, electrically conductive adhesive or solder paste may be applied to the contacts WAC, WEC of carrier 300 for making a mechanical connection as well as an electrical connection therewith.

FIG. 4C illustrates an optional variation of substrate 310 of carrier 300 wherein one or more irregularities and/or indentations are provided along any one or more edges of substrate 310. Such irregularities and/or indentations are provided for guiding conductive yarn 120, 140 into alignment with contacts WAC, WEC. Examples of suitable irregularities include "V"-shaped notches 316 and/or curved or circular indentations 318. In each example, irregularities 316, 318 are generally aligned with the long axis of rectangular contacts WAC, WEC in like manner to the desired alignment of conductive yarn 120, 140 therewith.

Figure 5:
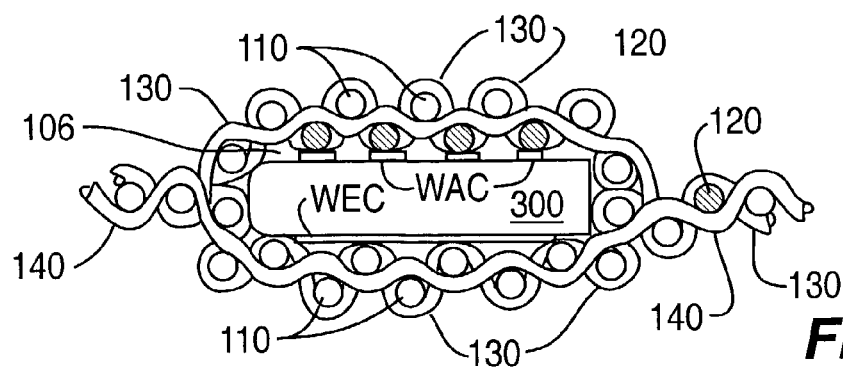
FIG. 5 is a partial cross-sectional schematic diagram illustrating an example circuit carrier disposed in a cavity of a multilayer woven fabric.

FIG. 5 is a partial cross-sectional schematic diagram illustrating an example circuit carrier 300 disposed in a cavity 106 of a multilayer woven fabric 100. Carrier 300 is snugly enclosed in cavity 106 with electrically conductive warp yarn 120 (cross-sectioned with diagonal lines) in physical and electrical contact with warp carrier contacts WAC in the warp direction and with electrically conductive weft yarn 140 in physical and electrical contact with weft carrier contacts WEC in the weft direction. Insulated warp yarn 110 and weft yarn 130 are interwoven therewith to define cavity 106. While the illustrated cross-section is cut along the weft direction, a cross-section if cut along the warp direction would appear similar, although the designations of warp and weft yarn would be interchanged.

It is noted that the tension of the yarn tends to enclose carrier 300 snugly and in proper position within cavity 106 so that reliable electrical connection between electrically conductive warp yarn 120 and carrier warp contacts WAC, and between electrically conductive weft yarn 140 and carrier weft contacts WEC, is provided solely as a result of the physical contact therebetween, without the need for a solder or an electrically conductive adhesive connection, although such connections may be employed.

Figure 6A:
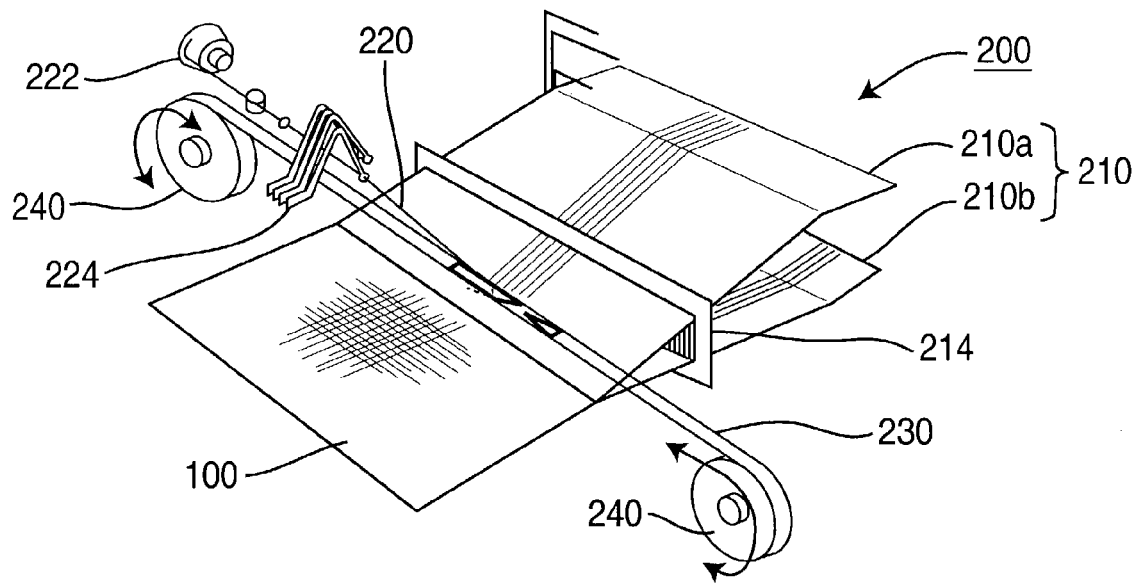
FIGS. 6A and 6B are schematic diagrams illustrating example loom arrangements suitable for making example embodiments of fabric described herein.
Figure 6B:
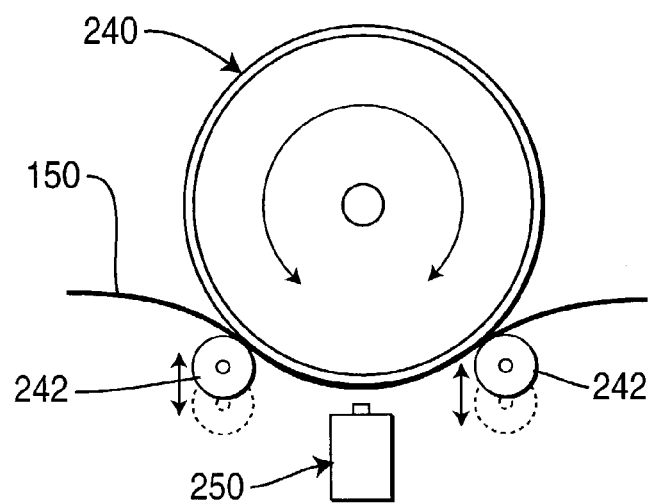

FIGS. 6A and 6B are schematic diagrams illustrating example loom arrangements suitable for making the example embodiments described herein. Rapier loom 200 weaves warp yarn 210 and weft yarn 220 into a fabric or textile 100. Alternate first ones 210a of the warp yarn 210 are raised and second ones 210b of the warp yarn 210 intermediate therewith are lowered whilst weft yarn 220 drawn from weft supply 222 is pulled between the raised and lowered warp yarn 210a, 210b, respectively, by rapier 230. Comb or reed 214 maintains the spacing and position of warp yarn 210 in the opening or shed formed by separated warp yarn 210a, 210b being raised and lowered alternately during weaving. Typically, rapier 230 is a flexible rapier 230 and is pulled back and forth between rapier capstan wheels 240 for pulling weft yarn 220 from weft supply 222 and through the space between raised and lowered warp yarn 210a, 210b. Then, the raised first warp yarn 210a are lowered and the lowered second warp yarn 210b are raised and another weft yarn 220 from weft supply 222 is pulled therebetween by rapier 230. Next, the raised second warp yarn 210b are lowered and the lowered first warp yarn 210a are raised and another weft yarn 220 from weft supply 222 is pulled therebetween by rapier 230, and the weaving sequence repeats interweaving warp and weft yarn 210, 220 for weaving fabric/textile 210.

For multilayer weaving, warp yarn 210 in each layer or in part of a layer is raised and lowered in accordance with the desired weave pattern as weft yarn 220 is woven therethrough, as is known for conventional fabrics in the art of weaving. The raising and lowering of warp yarn 210 and the weaving of weft yarn 220 produces cavities 106 in the woven fabric wherein two layers are separately woven in a region defining the cavity 106 and are interwoven in the region surrounding the cavity, thereby to form a closed cavity or pocket 106. As a cavity 106 is woven, a circuit carrier 300 is inserted into each partially woven cavity 106 before cavity 106 is woven to closure to surround the carrier 300. Modern, automated computer-controlled looms can rapidly and reliably raise and lower a few or many warp yarn very rapidly and in complicated patterns, as may be desired for weaving cavities 106 in desired positions in a fabric.

Warp yarn 210 may include insulating yarn, electrically conductive yarn and/or functional yarn, in any desired sequence. Typically, one or more insulating yarn are woven between electrically conductive yarn and/or functional yarn to provide physical spacing and electrical insulation between adjacent ones thereof.

Where weft supply 222 provides weft yarn 220 of different colors or of different types, such as insulating yarn, electrically conducting yarn and/or functional yarn, selector 224 selects the appropriate weft yarn 220 at the appropriate times for providing the sequence of weft yarn desired for fabric 100. Where weft yarn 220 is electrically conducting, for example, selector 224 selects an insulating yarn 220 for the weft threads woven prior to and following the insulating yarn, so that adjacent conductive yarn are not contiguous, but are separated by an insulating yarn and so are insulated one from the other. In some cases, however, it may be desired that plural conductive yarn be contiguous, e.g., in parallel for increasing current carrying capacity and/or increasing the reliability of the contact with conductive warp yarn and/or functional warp yarn at the crossings thereof.

Where, for example, it is desired to produce a fabric or textile 100 wherein different functional yarn are woven into the weft, either in a single layer or in a multilayer weave, weft supply 222 provides functional weft yarn 220 of different colors or of different types, selector 224 selects the appropriate functional weft yarn 220 at the appropriate times for providing the sequence of weft yarn desired. One example of a fabric employing different functional yarn is a multicolor display fabric, as for a two-color, three-color, or full-color display. In such case, weft supply 222 selects the functional weft yarn having the appropriate color light emitters thereon. For example, functional yarn having LEDs producing red light, functional yarn having LEDs producing green light, and functional yarn having LEDs producing blue light may be woven into fabric 100 in a red-green-blue sequence for providing a display fabric having the capability to produce color images when the red, green and blue light emitting elements are activated at suitable times and at suitable illumination intensities.

FIG. 6B is a schematic diagram illustrating an example capstan 240 and roller 242 arrangements suitable for utilization with the example loom 200 of FIG. 6A. Capstan wheel rotates clockwise and counterclockwise, i.e. bidirectionally, for feeding any weft yarn in weaving by loom 100. Rollers 242 are spring loaded or otherwise biased so as to press against capstan wheel 240 so as to maintain the weft yarn in frictional contact therewith so that it can be inserted into the weft of the fabric/textile being woven by loom 100. In particular, functional weft yarn 150 is so woven by capstan wheel 240 into the weft of a fabric. So that functional yarn 150 may be properly positioned with respect to the weft direction of fabric 100, sensor 250 is positioned proximate capstan wheel 240 in a location where one or more registration indicia 180 of functional yarn 150 may be detected. Sensor 250 may be an optical detector for detecting one or more optical (e.g., reflective) indicia on functional yarn 150 and/or may be an electrical detector such as a continuity detector for detecting one or more electrically conductive (e.g., metal contact) indicia 180 of functional yarn 150 and/or may be a mechanical detector for detecting one or more mechanical features of functional yarn 150.

Alternatively, an arm attached to loom 100 may be utilized pull the yarn out of the shed to counter the rapier pulling the yarn into the shed, thereby to properly position functional yarn 150 and register elements thereof. Also alternatively, where the rapier is designed to draw the weft yarn into the shed a predetermined distance with suitable tolerance, registration mark(s) 180 may be utilized to position functional yarn 150 in predetermined manner for subsequently being drawn into the loom by the predetermined rapier distance.

Figure 7:
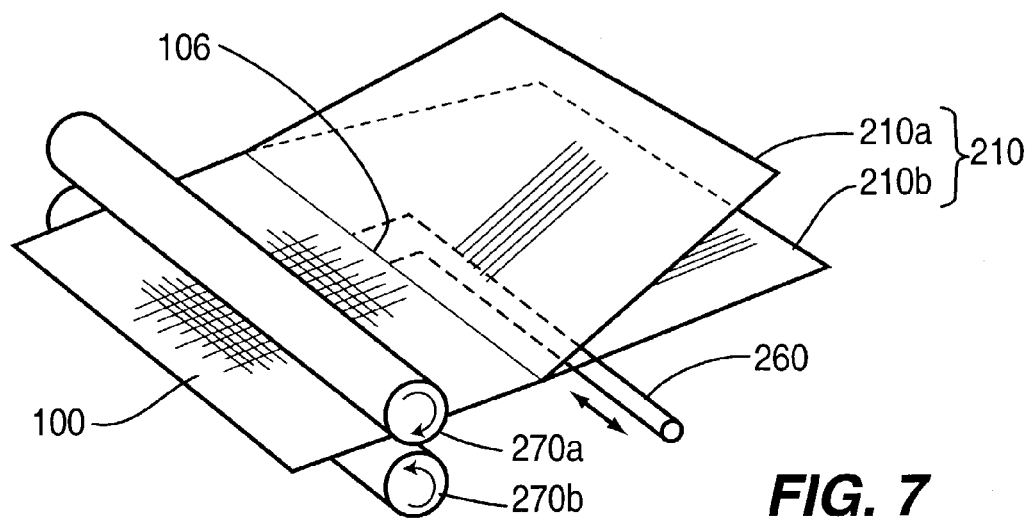
FIG. 7 is a schematic diagram of an example carrier insertion arrangement and an example roller arrangement suitable for weaving and finishing fabric woven in accordance with FIGS. 6A–6B.

FIG. 7 is a schematic diagram of an example carrier insertion arrangement 260 and an example roller arrangement 270 suitable for weaving and finishing multilayer weave fabric woven in accordance with FIGS. 6A–6B. Carrier insertion is provided, for example, by carrier insertion rod 260 which moves laterally (as indicated by the double-ended arrow) into and out of the shed (reed or comb 214 not shown) for inserting circuit carriers 300 into cavities 106 in fabric 100. When the weave has progressed to the point where one or more cavities 106 are partially woven, the weaving of weft yarn by the rapier ceases for a short time wherein carrier insertion rod is inserted into the shed and dispenses circuit carriers 300 in predetermined orientation into the partially woven cavities 106. When the carriers have been inserted into the partially woven cavities 106, insertion rod 260 is withdrawn and weaving of weft yarn resumes to complete the weaving of cavities 106 enclosing carriers 106.

Carrier insertion rod 260 may dispense one carrier at a time, e.g., as in a pick-and-place operation, or may dispense plural carriers 300 at a time, e.g., as in a contemporaneous pick-and-place operation. Alternatively, insertion rod 260 may include a carrier feed arrangement wherein carriers 300 are fed along insertion rod 260 and are dispensed from one or more locations thereon. Any of the foregoing may be employed where all of carriers 300 are of like type and/or where carriers 300 are of different types.

Optional roller 270 includes a pair of heated rollers 270a, 270b between which woven fabric 100 passes as it is woven on loom 200. Where circuit carriers 300 include, e.g., thermoplastic and/or thermosetting electrically conductive adhesive on contacts WAC, WEC for making connection thereto, heated rollers 270a, 270b apply suitable heat and pressure for melting a thermoplastic adhesive and/or for melting and/or curing a thermosetting adhesive. Heated rollers 260 may similarly be employed where such thermoplastic adhesive and/or thermosetting adhesive is included on contacts of functional yarn 150.

Figure 8:
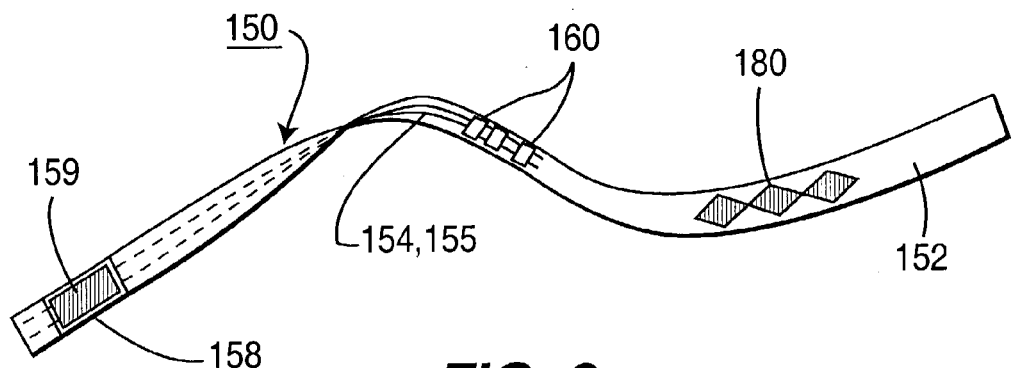
FIG. 8 is a schematic diagram of an example yarn including an example electronic circuit function suitable for use with the example loom arrangements of FIGS. 6A–6B.

FIG. 8 is a schematic diagram of an example yarn 150 including an example electronic circuit function suitable for use with the example loom arrangements 200 of FIGS. 6A–6B. Functional yarn 150 includes a flexible substrate 152 suitable for carrying electrical and/or electronic circuits thereon. For example, substrate 152 carries a plurality of electrical circuit components 160 attached thereto and connecting to conducting circuit traces 154, 156. External connection to conductors 154, 156 of functional yarn 150 is made via one or more contacts 158, an illustrated example of which is located at or near one or both ends of substrate 152. Secure and/or permanent connection thereto may be made, for example, by an electrically conductive adhesive 159, such as a thermoplastic or thermosetting adhesive, which is typically filled with electrically conductive particles, which is set or cured under heated compliant pressure pads or rollers. Functional yarn 150 also typically includes one or more registration marks or indicia 180 located at or near one end of yarn 150 for registering functional yarn 150, e.g., with respect to the warp yarn when functional yarn 150 is utilized in the weft. Such registration of functional yarn 150 is, for example, for positioning contacts 158 in locations in fabric 100 wherein they will make electrical connection with conductive yarn in the warp thereof and/or for positioning electronic devices 160 with respect to each other and fabric 100. To this end, registration indicia 180 is in known predetermined position along the length of substrate 152 of functional yarn 150 with respect to contacts 158 and/or electronic components/devices 160 thereof. Mark(s)/indicia 180 may be of any desired shape and may be optically reflective when intended for use with an optical detector and/or may be electrically conductive when intended for use with an electrical continuity or conductivity detector. Registration mark(s) 180 may also be utilized for properly aligning functional yarn on the loom where functional yarn is utilized in the warp of the fabric.

Figure 9:
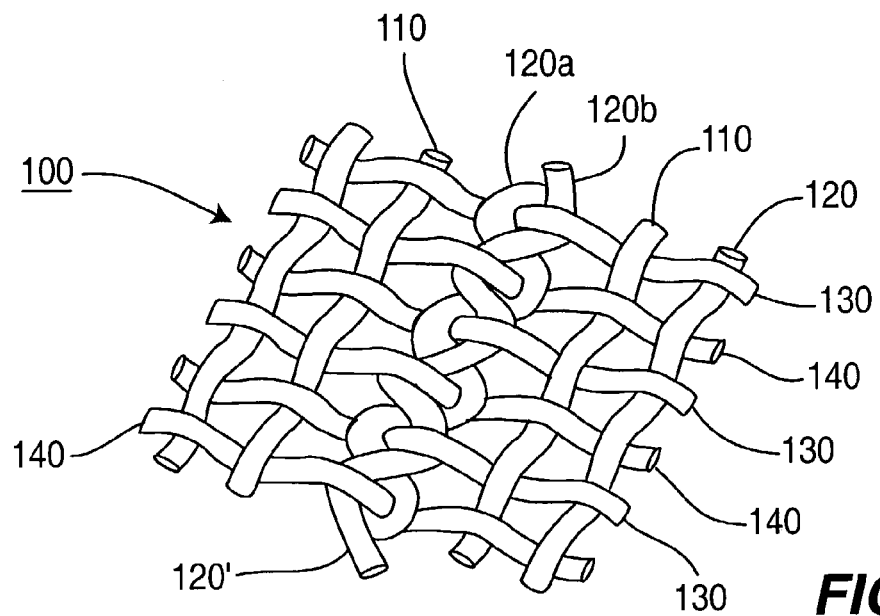
FIG. 9 is a schematic diagram of an example woven textile illustrating an ordinary weave and a complex weave useful in connection with the arrangements of FIGS. 1A to 3B.

FIG. 9 is a schematic diagram of an example woven textile 100 illustrating an ordinary weave and a complex weave which may be utilized in connection with any of the single layer and/or multilayer weaves herein. Example fabric 100 includes insulating yarn 110 and electrically conductive yarn 120 in the warp and insulating yarn 130 and conductive yarn 140 in the weft. Ordinarily, electrical connection between electrically conductive yarn 120 in the warp and electrically conductive yarn 140 in the weft is satisfactorily made by the physical contact therebetween in a plain weave having a typical tightness and/or density of yarn, as are connections between conductive yarn 120 and/or 140 and a functional yarn. Fabric so made have been observed to exhibit stable connection, e.g., as in bright, stable light from LEDs, under the application of shearing forces to the fabric, bending the fabric, and otherwise distorting and/or conforming the fabric shape.

For looser weaves and/or where highly reliable electrical contact is important, a more complex weave may be employed. For example, a Leno weave having plural conductive yarn 120a and 120b intertwined as they are woven to provide an electrically conductive yarn 120' may be utilized. Because the two conductive yarn 120a, 120b wrap around conductive yarn 140 (and/or a functional yarn) at locations where they cross, providing a tight weave and a connection of higher reliability thereat. While intertwined conductive yarn 120' is illustrated by way of example as being in the warp in the case of a Leno weave, twisted conductive yarn may be utilized in the warp and/or the weft and twisted yarn may be utilized with insulating and/or conductive yarn in other weaves.

While the electrically conductive yarn and the functional yarn are generally orthogonal and cross in a woven fabric or textile, the conductive and functional yarn need not be orthogonal, and conductive yarn and functional yarn may run in the same weave direction in a fabric or textile. Further, while either or both electrically conductive yarn and functional yarn may be woven in either or both the warp and/or the weft, it is generally preferred that electrically conductive yarn be woven in the warp and functional yarn be woven in the weft, for example, to permit different functional yarn to be utilized in a fabric/textile. For example, by utilizing a first type of functional yarn containing sensors and/or light sources and a second type of functional yarn containing processors in the same fabric, a "smart" fabric may be woven that both senses data and processes the data sensed and/or that generates addressing for illuminating light sources and illuminates the addressed light sources.

Woven textiles including electronic function as described herein are suitable for many different applications and/or articles having utility for consumer, private, public, professional, commercial, government, military and other entities. Among such are, for example, programmable alpha-numeric signage as for traffic warning, advertising, window signs, banners, portable signs, garments and articles of clothing (e.g., for people and/or animals), safety-wear bibs, vests and other safety garments, footwear, articles and/or garments for a baby and/or an infant, personal flotation devices, life saving apparatus, blankets, medical devices, light blankets, warming blankets, sensing blankets, apparatus and/or equipment for sport, sports wear, uniforms, toys, entertainment devices, truck and other vehicle signage, construction and/or work area signs, directional signs, lighting, emergency lighting, lighting panels, decorative lights, accent lights, reading lights, lighting for a tent, tarp, canvas and/or umbrella, display lighting, sensor fabrics, environmental and/or chemical and/or biological agent sensor arrays, camouflage, a parachute, a uniform (e.g., for government, military, sport and/or medical personnel), light sensing arrays, imaging arrays, and any other article including a woven fabric.

In each application, because the article is a woven fabric article it has the give and drape characteristics of fabric, and so can be hung, draped, folded, rolled or otherwise placed in a non-planar condition. Thus, even very large articles can be folded, rolled up or otherwise stored in a small space. For example, a 2 by 3 meter sign could easily be folded and/or rolled up and placed in the trunk or other storage compartment of a vehicle such as a police, fire, ambulance or other emergency vehicle and/or the storage space of a truck or automobile. In addition, a lightweight pop-up support frame, similar to the support frames employed with a camping tent, may be employed with a textile article as described herein. When unfolded, woven fabric articles may be draped or otherwise placed to conform to a desired surface and/or shape.

The yarn utilized in weaving the fabric may be made wider consistent with the size of the woven sign and the resolution and/or pixel or display element size desired and/or the capability of the loom (either an automated or a manual loom) to weave wide yarn. For example, standard modem looms can weave yarn up to about 10 mm wide. A large display and/or sign, such as a banner scoreboard, may be 10 meter long and 1 meter wide, and may, e.g., be woven of yarn and functional yarn strips having a width of about 2–3 cm. Because the message presented by such large signs and banners is easily changed, one sign or banner can be reused many times for many different purposes, the cost is lower than if a different printed sign is utilized for each event, and external illumination is not needed for use during darkness. Signs and banners may be rolled, e.g., on a window-shade-type roller for convenient and quick set up and removal, or may simply be folded.

While the present invention has been described in terms of the foregoing exemplary embodiments, variations within the scope and spirit of the present invention as defined by the claims following will be apparent to those skilled in the art. For example, while it is preferred that cavities in a multilayer woven fabric be closed, i.e. completely surround a circuit carrier disposed therein, a closed cavity is not mandatory. Open pockets may be employed in which case circuit carriers therein may be easily removed and inserted after the fabric is woven, thereby facilitating the reconfiguration or modification of the function of an electronic textile, or for purposes of the repair, maintenance, upgrading and/or updating thereof.

Electrical connection to contacts and/or conductors of functional yarn may be made directly to the functional yarn at an edge of the fabric or may be made via crossing conductive yarn to which connections are made at an edge of the fabric, or a combination of connection arrangements may be utilized.

In addition, functional yarn could include an electrically conductive substrate on which are placed electronic devices and contacts therefor, wherein an insulating layer and/or a pattern of insulating areas are disposed on the conductive substrate to provide insulation for such contacts. Further, placement and registration of functional yarn in a fabric may be to align the electronic devices thereon, or registration of the functional yarn may be to place such devices in a pattern other than an aligned pattern, as might be desirable for an electronically functional fabric utilized for camouflage.

While sufficient electrical connection between conductive yarn and/or functional yarn is typically made at locations where such yarn cross in a fabric, other conductive adhesive such as ultraviolet-cured adhesive may optionally be employed to improve such connection.

As stated herein, examples of a fabric, textile and/or article having a particular yarn in one of the warp and weft is intended to describe the fabric, textile and/or article with such yarn in the warp, in the weft, or in the warp and in the weft. Any weave may be employed, including but not limited to, plain or tabby, twill, overshot, laid-in, leno, gauze, loop, double, multilayer, combinations thereof, and any other weave.

The term "yarn" herein refers to one or more yarn, i.e. "yarn" includes the singular and the plural, consistent with the context.

The terms electrical device, electronic device, electrical component and electronic component are used interchangeably herein, and any one is intended to include any or all of the others. The same is true as to the terms conductor, contact and terminal, e.g., in the context of a functional yarn and/or electronic device, and the terms "electrical" and "electronic." Similarly, "optical" devices include, for example, devices that detect and/or produce electromagnetic radiation, and/or that otherwise operate, in the visible, infrared, ultra-violet, x-ray and/or other regions of the electromagnetic spectrum, including a narrow band thereof such as would define a "color."

What is claimed is:

1. A multilayer woven article having a warp and a weft, and defining an electrical circuit, said multilayer woven article comprising:
    a plurality of electrically insulating yarns and uninsulated electrically conductive yarns in the warp;
    a plurality of electrically insulating yarns and uninsulated electrically conductive yarns in the weft interwoven with said plurality of electrically insulating yarns and uninsulated electrically conductive yarns in the warp in a weave defining plural layers of said woven article;
    wherein an uninsulated electrically conductive yarn in the warp crossing an uninsulated electrically conductive yarn in the weft makes electrical connection therewith at the crossing thereof; and
    at least one uninsulated electrically conductive yarn in the warp and/or in the weft woven into at least a first layer and a second layer of the plural layers for crossing at least one uninsulated electrically conductive yarn in the other of the warp and/or weft without making electrical contact therewith;
    whereby a multilayer woven article is provided wherein uninsulated electrically conductive yarn disposed in the warp and weft are woven so as to connect at certain crossings when in the same one of the plural layers and to not connect at other crossings when not in the same one of the plural layers to define an electrical circuit.

2. The multilayer woven article of claim 1 wherein said plurality of electrically insulating yarns and/or electrically conductive yarns includes at least one electrically conductive yarns in the warp in electrical contact with at least one electrically conductive yarn in the weft at a crossing thereof without mechanically attaching the electrically conductive yarn thereat.

3. The multilayer woven article of claim 1 further comprising:
    at least one functional yarn in one of the warp and the weft adjacent an electrically insulating yarn, wherein the functional yarn comprises an elongate substrate including at least one electrical conductor disposed thereon and at least one electronic device on the elongate substrate and electrically connected to the at least one electrical conductor thereon,
    wherein the at least one electrical conductor of said at least one functional yarn and at least one uninsulated electrically conductive yarn in the other of the warp and the weft cross for providing at the crossing an electrical connection between the electric device and the at least one uninsulated electrically conductive yarn.

4. The multilayer woven article of claim 1 further comprising electrically insulating yarns woven in a third layer intermediate the first and second layers of the plural layers for interposing an insulating layer between uninsulated electrically conductive yarns in the first and second layers of the plural layers.

5. A method for weaving a fabric and/or a textile electrical circuit article having a warp and a weft comprising:

provide a plurality of electrically insulating yarns and uninsulated electrically conductive yarns in the warp;

weaving a plurality of electrically insulating yarns, and uninsulated electrically conductive yarns in the weft with said plurality of electrically insulating yarns and uninsulated electrically conductive yarns in the warp;

wherein said weaving defines plural layers of the electrical circuit article;

wherein an uninsulated electrically conductive yarn in the warp crossing an uninsulated electrically conductive yarns in the weft in the same layer of the plural layers makes electrical connection therewith at the crossing thereof; and weaving at least one uninsulated electrically conductive yarn in the warp and/or in the weft into at least a first layer and a second layer of the plural layers for crossing at least one uninsulated electrically conductive yarn in the other of the warp and/or well without making electrical contact therewith;

whereby a woven electrical circuit article is provided wherein electrically conductive yarn disposed in the warp and the weft are woven so as to connect at certain crossings when in the same one of the plural layers and to not connect at other crossings when not in the same one of the plural layers.

6. The method of claim 5 wherein said weaving a plurality of electrically insulating yarns and/or electrically conductive yarns includes controlling a tightness of the weave and/or a density of yarn for maintaining at least one electrically conductive yarn in the warp in electrical contact with at least one electrically conductive yarn in the weft at a crossing thereof without mechanically attaching the electrically conductive yarns thereat.

7. The method of claim 5 further comprising:

weaving at least one functional yarn in one of the warp and the weft adjacent an electrically insulating yarn, wherein the functional yarn comprises an elongate substrate including at least one electrical conductor disposed thereon and at least one electronic device on the elongate substrate and electrically connected to the at least one electrical conductor thereon, wherein the at least one electrical conductor and at least one electrically conductive yarn in the other of the warp and the weft cross for providing an electrical connection between the electronic device and the at least one electrically conductive yarn.

8. The method of claim 7 wherein said weaving a plurality of electrically insulating yarns and/or electrically conductive yarns and said weaving at least one functional yarn include controlling a tightness of the weave and/or a density of yarn for maintaining the at least one electrical conductor of the functional yarn in electrical contact with an electrically conductive yarn at a location where the functional yarn crosses the electrically conductive yarn in the woven fabric and/or article without mechanically attaching the functional yarn and the electrically conductive yarn at that location.

9. The multilayer woven article of claim 1 wherein at least two of the plural layers define at least one cavity there between and wherein at least one of the two layers defining the at least one cavity has at least one of the uninsulated electrically conductive yarns adjacent the at least one cavity, said woven article further comprising:

a circuit carrier having at least one exposed electrical contact, said circuit carrier including at least one electronic device connected to the electrical contact for performing a function, and wherein said circuit carrier is disposed in the at least one cavity with its at least one exposed electrical contact in electrical connection with said at least one of the uninsulated electrically conductive yarns.

10. The method of claim 5 wherein said weaving defines at least one cavity between the first and second layers, and wherein at least one of the first and second layers defining the at least one cavity has at least one of the uninsulated electrically conductive yarns adjacent the at least one cavity, said method further comprising:

placing a circuit carrier in the at least one cavity, wherein the circuit carrier includes exposed electrical contacts providing electrical connection between an electronic device in the circuit carrier and the at least one of the uninsulated electrically conductive yarns in the warp and/or the weft that is woven in the at least one of the first and second layers defining the at least one cavity.

* * * * *

UNITED STATES PATENT AND TRADEMARK OFFICE
CERTIFICATE OF CORRECTION

PATENT NO. : 7,144,830 B2  Page 1 of 1
APPLICATION NO. : 10/431763
DATED : December 5, 2006
INVENTOR(S) : Hill et al.

It is certified that error appears in the above-identified patent and that said Letters Patent is hereby corrected as shown below:

On the title page, item (73)

after "(US)," insert --and Philadelphia University, Philadelphia, PA (US)--

Signed and Sealed this

Twenty-seventh Day of October, 2009

David J. Kappos
*Director of the United States Patent and Trademark Office*